(12) United States Patent
Choi

(10) Patent No.: US 11,437,409 B2
(45) Date of Patent: Sep. 6, 2022

(54) ARRAY SUBSTRATE AND MANUFACTURING METHOD THEREOF, AND DISPLAY DEVICE

(71) Applicant: BOE Technology Group Co., Ltd., Beijing (CN)

(72) Inventor: Seungjin Choi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 722 days.

(21) Appl. No.: 16/335,085

(22) PCT Filed: Aug. 20, 2018

(86) PCT No.: PCT/CN2018/101373
§ 371 (c)(1),
(2) Date: Mar. 20, 2019

(87) PCT Pub. No.: WO2019/091182
PCT Pub. Date: May 16, 2019

(65) Prior Publication Data
US 2021/0351203 A1 Nov. 11, 2021

(30) Foreign Application Priority Data
Nov. 10, 2017 (CN) .......................... 201711105473.8

(51) Int. Cl.
*H01L 27/12* (2006.01)
*G02F 1/1362* (2006.01)
(Continued)

(52) U.S. Cl.
CPC ........ *H01L 27/124* (2013.01); *G02F 1/13606* (2021.01); *G02F 1/13629* (2021.01);
(Continued)

(58) Field of Classification Search
CPC ............... H01L 27/124; H01L 27/1218; H01L 27/3276; H01L 29/41733; G02F 1/136286; G02F 1/134372
See application file for complete search history.

(56) References Cited

U.S. PATENT DOCUMENTS 9,543,156 B1 * 1/2017 Hu .................... H01L 21/28247
9,568,760 B2    2/2017 Woo et al.
(Continued)

FOREIGN PATENT DOCUMENTS

CN    202183002 U    4/2012
CN    104062814 A    9/2014
(Continued)

OTHER PUBLICATIONS

Jun. 2, 2020—(CN) First Office Action Appn 201711105473.8 with English Translation.
(Continued)

*Primary Examiner* — Peter M Albrecht
(74) *Attorney, Agent, or Firm* — Banner & Witcoff, Ltd.

(57) ABSTRACT

An array substrate and a manufacturing method thereof, and a display device. The array substrate includes: a base substrate, including a first surface and a second surface opposite to each other, and a through-hole penetrating the base substrate from the first surface to the second surface; a data line on the first surface of the base substrate, the data line being at least partially filled in the through-hole; a thin film transistor on the second surface of the base substrate, the thin film transistor including a source electrode and a drain electrode, and the source electrode being electrically connected to the data line.

14 Claims, 7 Drawing Sheets

(51) Int. Cl.
*G02F 1/136* (2006.01)
*G02F 1/1368* (2006.01)
*G02F 1/1343* (2006.01)

(52) U.S. Cl.
CPC ...... *G02F 1/136295* (2021.01); *H01L 27/127* (2013.01); *H01L 27/1218* (2013.01); *H01L 27/1288* (2013.01); *G02F 1/1368* (2013.01); *G02F 1/134363* (2013.01); *H01L 27/1262* (2013.01)

(56) References Cited

U.S. PATENT DOCUMENTS

| | | | |
|---|---|---|---|
| 9,773,855 | B2 | 9/2017 | Wu |
| 9,799,679 | B2 | 10/2017 | Ning |
| 9,841,639 | B2 | 12/2017 | Jiang et al. |
| 2009/0201455 | A1 | 8/2009 | Murai |
| 2012/0138940 | A1* | 6/2012 | Sato ................ H01L 27/124 257/59 |
| 2013/0038581 | A1 | 2/2013 | Yagi |
| 2013/0071973 | A1 | 3/2013 | Beak et al. |
| 2015/0084019 | A1 | 3/2015 | Ren |
| 2016/0351650 | A1 | 12/2016 | Chang |
| 2017/0153511 | A1* | 6/2017 | Um ................ G02F 1/136286 |

FOREIGN PATENT DOCUMENTS

| | | | |
|---|---|---|---|
| CN | 104217994 | A | 12/2014 |
| CN | 104916252 | A | 9/2015 |
| CN | 105448824 | A * | 3/2016 |
| CN | 105739203 | A | 7/2016 |
| CN | 105789225 | A | 7/2016 |
| CN | 106409796 | A | 2/2017 |
| GN | 107256870 | A | 10/2017 |
| JP | 04101424 | A * | 4/1992 |
| WO | 2014044166 | A1 | 3/2014 |

OTHER PUBLICATIONS

Jul. 21, 2021—(EP) Extended European Search Report Appn 18855144.4.

Nov. 26, 2018—(WO) International Search Report and Written Opinion Appn PCT/CN2018/101373 with English Translation.

* cited by examiner

ARRAY SUBSTRATE AND MANUFACTURING METHOD THEREOF, AND DISPLAY DEVICE

The application is a U.S. National Phase Entry of International Application No. PCT/CN2018/101373 filed on Aug. 20, 2018, designating the United States of America and claiming priority to Chinese Patent Application No. 201711105473.8, filed on Nov. 10, 2017. The present application claims priority to and the benefit of the above-identified applications and the above-identified applications are incorporated by reference herein in their entirety.

TECHNICAL FIELD

At least one embodiment of the present disclosure relates to an array substrate, and a manufacturing method thereof, and a display device.

BACKGROUND

In general, a technology for producing a product having a high aperture advanced-super dimensional switching (HADS) characteristic includes an organic film technology. The application of the organic film technology can significantly reduce a parasitic capacitance between a common electrode and a data line, thereby reducing power consumption.

SUMMARY

At least one embodiment of the present disclosure provides an array substrate and a manufacturing method thereof, and a display device. The array substrate includes: a base substrate, including a first surface and a second surface opposite to each other, and a through-hole penetrating the base substrate from the first surface to the second surface; a data line on the first surface of the base substrate, the data line being at least partially filled in the through-hole; and a thin film transistor on the second surface of the base substrate, the thin film transistor including a source electrode and a drain electrode, and the source electrode being electrically connected to the data line.

In some examples, the array substrate further includes: a common electrode on the second surface of the base substrate.

In some examples, an orthographic projection of the data line on the base substrate at least partially overlaps with an orthographic projection of the common electrode on the base substrate.

In some examples, in a direction perpendicular to the second surface of the base substrate and away from the second surface, the source electrode and the drain electrode include a first conductive layer and a second conductive layer stacked in sequence, and an orthographic projection of the first conductive layer on the base substrate and an orthographic projection of the second conductive layer on the base substrate completely coincide with each other.

In some examples, a material of the first conductive layer is a transparent conductive material the same as a material of the common electrode, and the first conductive layer and the common electrode are disposed in a same layer.

In some examples, the array substrate further includes: a first passivation layer on a side of the common electrode away from the base substrate; and a pixel electrode on a side of the first passivation layer away from the common electrode.

In some examples, the thin film transistor further includes a gate insulating layer, the gate insulating layer includes a via hole, and the source electrode is electrically connected to the data line through the via hole.

In some examples, the common electrode is directly disposed on the gate insulating layer.

In some examples, the array substrate further includes: a second passivation layer on a side of the data line away from the base substrate.

At least one embodiment of the present disclosure provides a manufacturing method of an array substrate, which includes: providing a base substrate, the base substrate including a first surface and a second surface opposite to each other, and a through-hole penetrating the base substrate from the first surface to the second surface; forming a data line on the first surface of the base substrate, the data line being at least partially filled in the through-hole; and forming a thin film transistor on the second surface of the base substrate, forming the thin film transistor including forming a source electrode and a drain electrode, and the source electrode being electrically connected to the data line.

In some examples, providing the base substrate includes: forming the through-hole in the base substrate.

In some examples, the manufacturing method of the array substrate further includes: forming a common electrode on the second surface of the base substrate, wherein the source electrode, the drain electrode and the common electrode are formed by one patterning process.

In some examples, forming the thin film transistor further includes: forming an insulating material layer and a semiconductor layer in sequence on the second surface of the base substrate; and forming a gate insulating layer and an active layer by using one patterning process on the insulating material layer and the semiconductor layer. The gate insulating layer includes a via hole, and the source electrode is electrically connected to the data line through the via hole.

In some examples, forming the gate insulating layer and the active layer by using one patterning process on the insulating material layer and the semiconductor layer includes: forming a first photoresist layer on the semiconductor layer; forming a first photoresist-completely-retained region, a first photoresist-partially-removed region, and a first photoresist-completely-removed region by patterning the first photoresist layer, a thickness of photoresist in the first photoresist-completely-retained region being greater than a thickness of photoresist in the first photoresist-partially-removed region; forming the gate insulating layer including the via hole by etching the insulating material layer and the semiconductor layer in the first photoresist-completely-removed region; ashing the first photoresist layer to reduce the thickness of the photoresist in the first photoresist-completely-retained region, and to remove the photoresist in the first photoresist-partially-removed region completely; and forming the active layer by etching the semiconductor layer in the first photoresist-partially-removed region.

In some examples, before forming the insulating material layer, the manufacturing method of the array substrate further includes: forming a buffer material layer on the second surface of the base substrate, wherein forming the gate insulating layer and the active layer by using one patterning process on the insulating material layer and the semiconductor layer includes: forming a buffer layer and the gate insulating layer by using one patterning process on the buffer material layer and the insulating material layer.

In some examples, forming the source electrode, the drain electrode and the common electrode includes: forming a first conductive material layer on the second surface of the base substrate; forming a second conductive material layer on the first conductive material layer; forming a second photoresist layer on the second conductive material layer; forming a second photoresist-completely-retained region, a second photoresist-partially-removed region, and a second photoresist-completely-removed region by patterning the second photoresist layer, a thickness of photoresist in the second photoresist-completely-retained region being greater than a thickness of photoresist in the second photoresist-partially-removed region; forming a first conductive layer and a second conductive layer respectively by etching the first conductive material layer and the second conductive material layer in the second photoresist-completely-removed region; ashing the second photoresist layer to reduce the thickness of the photoresist in the second photoresist-completely-retained region, and to remove the photoresist in the second photoresist-partially-removed region completely; etching the second conductive layer in the second photoresist-partially-removed region to remove the second conductive layer, so as to form the common electrode; forming the source electrode and the drain electrode by stripping the photoresist in the second photoresist-completely-retained region.

In some examples, the manufacturing method of the array substrate further includes: forming a first passivation layer on a side of the common electrode away from the base substrate; and forming a pixel electrode on a side of the first passivation layer away from the common electrode.

In some examples, after forming the data line, the manufacturing method of the array substrate further includes: forming a second passivation layer on a side of the data line away from the base substrate.

At least one embodiment of the present disclosure provides a display device, which includes the array substrate provided by any one of the embodiments of the present disclosure.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

Figure 1A:
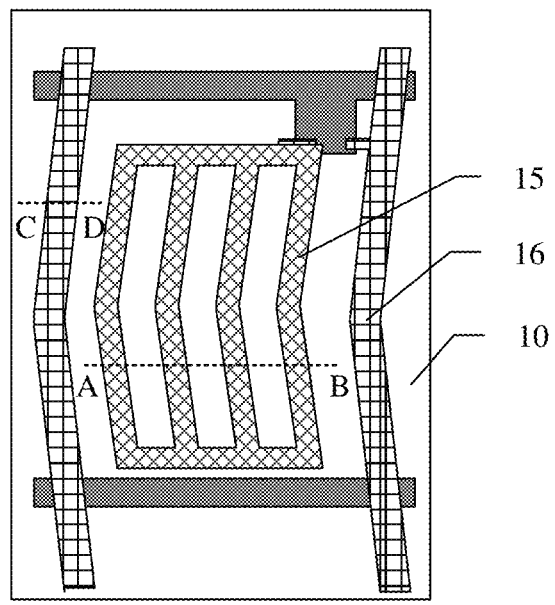
FIG. 1A is a partial plan view of a general array substrate.
Figure 1B:
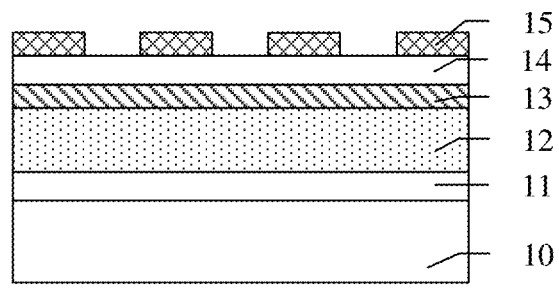
FIG. 1B is a cross-sectional view of the array substrate shown in FIG. 1A taken along line AB.
Figure 1C:
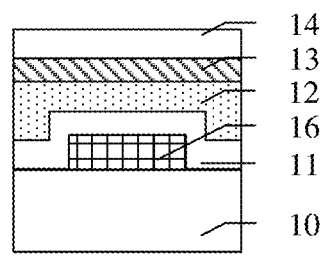
FIG. 1C is a cross-sectional view of the array substrate shown in FIG. 1A taken along line CD.

FIG. 1A is a partial plan view of an array substrate applying a high aperture advanced-super dimensional switching (HADS) technology, FIG. 1B is a cross-sectional view of the array substrate shown in FIG. 1A taken along line AB, and FIG. 1C is a cross-sectional view of the array substrate shown in FIG. 1A taken along line CD. As shown in FIGS. 1A-1C, the array substrate includes a gate insulating layer 10, a data line 16 on a side of the gate insulating layer 10 away from a base substrate (not shown), a first passivation layer 11 covering the data line 16, an organic film layer (for example, a resin layer) 12 on a side of the first passivation layer 11 away from the gate insulating layer 10, a common electrode 13 on a side of the organic film layer 12 away from the gate insulating layer 10, a second passivation layer 14 and a pixel electrode 15 on a side of the common electrode 13 away from the gate insulating layer 10. In order to clearly illustrate the structures such as the data line, etc., the common electrode and other structures are not shown in FIG. 1A, and the common electrode is a plate electrode covering at least a part of the data line.

Because the common electrode 13 overlaps with the data line 16 in a direction perpendicular to the base substrate, a parasitic capacitance is generated between the common electrode 13 and the data line 16, resulting in excessive power consumption of a display device, and affecting picture quality of the display device. Thus, in the array substrate illustrated in FIG. 1C, a resin layer 12 is added between the data line 16 and the common electrode 13 to reduce the parasitic capacitance generated between the common electrode 13 and the data line 16, thereby improving the quality of the display device. In addition, a gate insulator mask process is added in the manufacturing process of the array substrate to improve production yield.

In a study, an inventor of the present application has found that the additional gate insulator mask process will result in an increase in the number of mask plates in the manufacturing process of the array substrate, that is, the number of mask plates will be increased and the productivity will be affected by using a seven-step patterning process.

Embodiments of the present disclosure provide an array substrate, and a manufacturing method thereof, and a display device. The array substrate includes: a base substrate, including a first surface and a second surface opposite to each other, and a through-hole penetrating the base substrate from the first surface to the second surface; a data line on the first surface of the base substrate, the data line being at least partially filled in the through-hole; and a thin film transistor on the second surface of the base substrate, the thin film transistor including a source electrode and a drain electrode, and the source electrode being electrically connected to the data line. The data line and the common electrode in the array substrate are respectively disposed on opposite sides of the base substrate, which can effectively reduce signal crosstalk between the data line and the common electrode, and minimize the parasitic capacitance formed between the data line and the common electrode, thereby improving picture quality of the display device, and can also save the process steps.

Hereinafter, an array substrate, and a manufacturing method thereof, and a display device, provided by embodiments of the present disclosure, will be described with reference to the accompanying drawings.

Figure 2A:
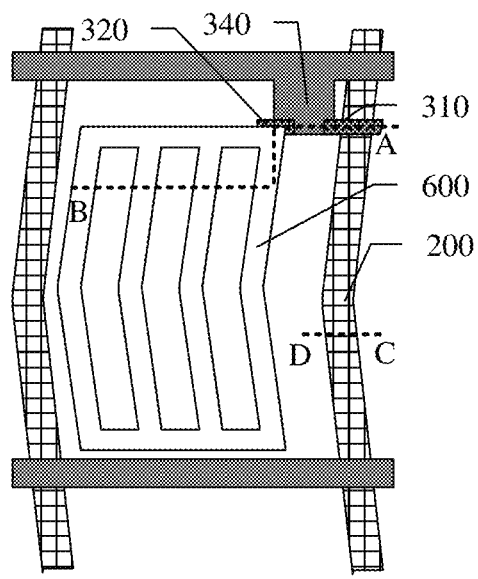
FIG. 2A is a partial plan view of an array substrate provided by an embodiment of the present disclosure.
Figure 2B:
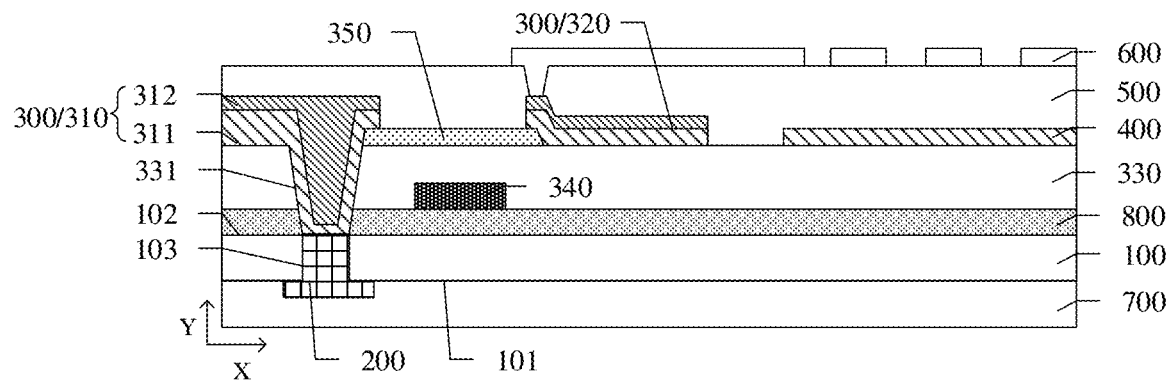
FIG. 2B is a cross-sectional view of the array substrate shown in FIG. 2A taken along line AB.
Figure 2C:
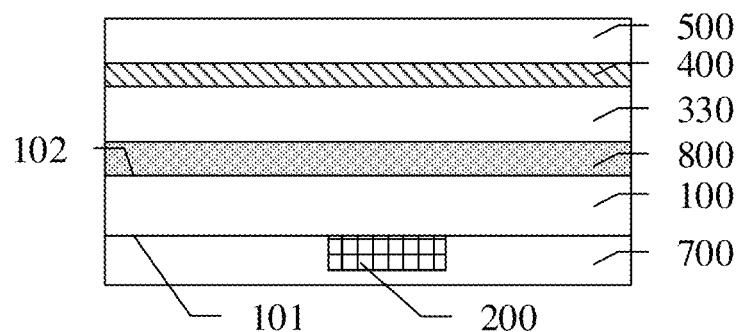
FIG. 2C is a cross-sectional view of the array substrate shown in FIG. 2A taken along line CD.

At least one embodiment of the present disclosure provides an array substrate. FIG. 2A is a partial plan view of an array substrate provided by an embodiment of the present disclosure, FIG. 2B is a cross-sectional view of the array substrate shown in FIG. 2A taken along line AB, and FIG. 2C is a cross-sectional view of the array substrate shown in FIG. 2A taken along line CD. As shown in FIG. 2A-FIG. 2C, the array substrate includes a base substrate 100, the base substrate 100 includes a first surface 101 and a second surface 102 opposite to each other in the Y direction, and a through-hole 103 penetrating the base substrate 100 from the first surface 101 to the second surface 102. The array substrate further includes a data line 200 on the first surface 101 of the base substrate 100, the data line 200 is at least partially filled in the through-hole 103. The data line 200 extends to the second surface 102 of the base substrate 100 through the through-hole 103, that is, a portion of the data line 200 penetrates the base substrate 100 through the through-hole 103. For example, the data line 200 extends in a direction perpendicular to the XY plane. The array substrate further includes a thin film transistor 300 on the second surface 102 of the base substrate 100, that is, the data line 200 and the thin film transistor 300 are respectively located on both sides of the base substrate 100 in the Y direction, and the thin film transistor 300 includes a source electrode 310 and a drain electrode 320, the source electrode 310 is electrically connected to the data line 200, that is, the source electrode 310 can be electrically connected to the portion of the data line 200 penetrating the through-hole 103. The Y direction here refers to a direction perpendicular to a main plane of the base substrate 100.

In some examples, as shown in FIG. 2A-FIG. 2C, the array substrate further includes a buffer layer 800 on the second surface 102 of the base substrate 100, that is, the buffer layer 800 is located on a side of the base substrate 100 away from the data line 200. The thin film transistor 300 further includes a gate electrode 340 located on a side of the buffer layer 800 away from the substrate 100.

In some examples, as shown in FIG. 2A-FIG. 2C, the thin film transistor 300 further includes a gate insulating layer 330 covering the gate electrode 340, the gate insulating layer 330 includes a via hole 331. For example, the buffer layer 800 between the gate insulating layer 330 and the base substrate 100 also includes a via hole, and the via hole 331 included in the gate insulating layer 330 and the via hole included in the buffer layer 800 are the same via hole formed in a same step of a patterning process. Moreover, the source electrode 310 is electrically connected to the data line 200 through the via hole 331, that is, an orthographic projection of the via hole 331 on the base substrate 100 at least partially overlaps with the through-hole 103 on the base substrate 100, therefore, the portion of the data line 200 extending to the second surface 102 of the base substrate 100 through the through-hole 103 is exposed by the via hole 331 of the gate insulating layer 330, so that the source electrode 310 can be electrically connected to the data line 200 though the via hole 331.

In some examples, as shown in FIG. 2A-FIG. 2C, the array substrate further includes a common electrode 400 on the second surface 102 of the base substrate 100, that is, the common electrode 400 is located on a side of the gate insulating layer 330 away from the data line 200. In order to clearly illustrate the structures such as the data line, etc., the common electrode is not shown in FIG. 2A, and the common electrode is a plate electrode covering at least a part of the data line.

In some examples, as shown in FIG. 2A-FIG. 2C, the common electrode 400 is directly disposed on the gate insulating layer 330, that is, no other film layer is included between the common electrode 400 and the gate insulating layer 330.

For example, as shown in FIG. 2A-FIG. 2C, the array substrate provided by the present embodiment is mainly applied to a high aperture advanced-super dimensional switching (HADS) product, therefore, the common electrode 400 included in the array substrate is an integral transparent conductive layer of an entire surface, which is included, but is not limited thereto in the present embodiment. For example, a material of the common electrode 400 may include a transparent conductive oxide. For example, the material of the common electrode 400 can include any combination or at least one of indium tin oxide, indium zinc oxide, zinc oxide, indium oxide, and indium gallium oxide, which is not limited in the embodiment of the present disclosure. For example, the material of the common electrode 400 can also include a metal material.

In some examples, as shown in FIG. 2C, an orthogonal projection of the data line 200 on the base substrate 100 at least partially overlaps with an orthographic projection of the common electrode 400 on the base substrate 100, therefore, the common electrode 400 can shield a signal of the data line 200, so as to prevent the signal of the data line 200 from affecting the deflection of liquid crystal molecules in the display device and further affecting display. In this case, the black matrix on the color filter substrate in the display device can be minimized, so that the aperture ratio of the display device can also be increased.

Generally, in the direction perpendicular to the substrate 100, the overlap between the common electrode 400 and the data line 200 results in a parasitic capacitance (Cdc) and signal crosstalk. In the embodiment of the present disclosure, the data line and common electrode are respectively disposed on opposite sides of the base substrate, which can effectively avoid signal crosstalk between the data line and the common electrode, and minimize the parasitic capacitance formed between the data line and the common electrode, thereby reducing power consumption and improving the picture quality of the display device, and also saving a process for manufacturing the resin layer and a mask plate for separately patterning the gate insulating layer, so that steps of the mask process are saved and the manufacturability is improved.

In some examples, as shown in FIG. 2B, in a direction perpendicular to the second surface 102 of the base substrate 100 and away from the second surface 102, that is, in the Y direction shown in FIG. 2B, the source electrode 310 and the drain electrode 320 include a first conductive layer 311 and a second conductive layer 312 stacked in sequence, and the first conductive layer 311 and the second conductive layer 312 have a same shape and a same size, that is, an orthographic projection of the first conductive layer 311 on the base substrate 100 and an orthographic projection of the second conductive layer 312 on the base substrate 100 completely coincide with each other.

In some examples, as shown in FIG. 2B, a material of the first conductive layer 311 and a material of the common electrode 400 are the same transparent conductive material, that is, the first conductive layer 311 included in the source electrode 310 and the drain electrode 320 is formed in the same layer as the common electrode 400, and the source electrode 310, the drain electrode 320 and the common electrode 400 are formed by one patterning process. Therefore, in the embodiment of the present disclosure, the source electrode and drain electrode and the common electrode are manufactured by using one mask plate, thereby saving process steps.

For example, the material of the first conductive layer 311 can include a transparent conductive oxide or a metal material, etc.

For example, the material of the second conductive layer 312 can include a copper material, the present embodiment includes but is not limited thereto.

In some examples, as shown in FIG. 2B, a display region of the array substrate further includes a first passivation layer 500 on a side of the common electrode 400 away from the base substrate 100, and a pixel electrode 600 on a side of the first passivation layer 500 away from the common electrode 400. The pixel electrode 600 is electrically connected to the drain electrode 320 of the thin film transistor 300. For example, the pixel electrode 600 in the present embodiment is a strip electrode.

In some examples, as shown in FIG. 2A-FIG. 2C, the array substrate further includes: a second passivation layer 700 on a side of the data line 200 away from the base substrate 100. The second passivation layer 700 is served to protect the data line 200 located on the first surface 101 of the base substrate 100.

For example, a material of the second passivation layer 700 can include an inorganic material such as a metal oxide, a metal sulfide, or a metal nitride, which is not limited in the present embodiment. For example, the metal oxide can include calcium oxide, zinc oxide, copper oxide, titanium dioxide, tin oxide, etc.; the metal sulfide can include iron sulfide, copper sulfide, zinc sulfide, tin disulfide, etc.; the metal nitride can include silicon nitride, aluminum nitride, etc., the present embodiments includes but is not limited thereto.

For example, the second passivation layer 700 has a thickness of 500 to 3000 Å in the Y direction, which is included, but is not limited thereto in the present embodiment. For example, the second passivation layer 700 has a thickness of 1000 Å.

Figure 3:
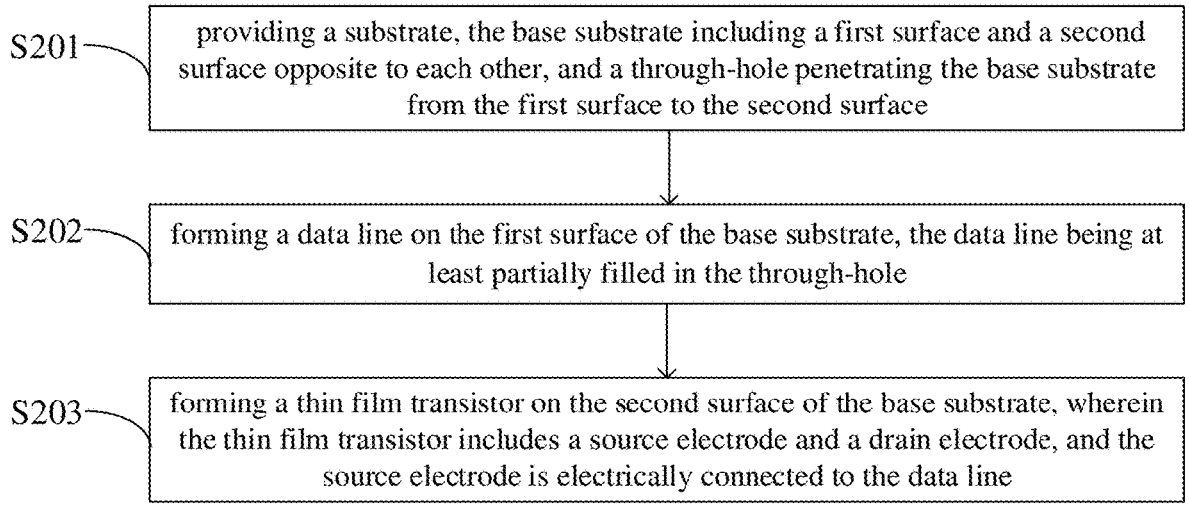
FIG. 3 is a flowchart of a manufacturing method of an array substrate provided by an embodiment of the present disclosure.
Figure 4A:
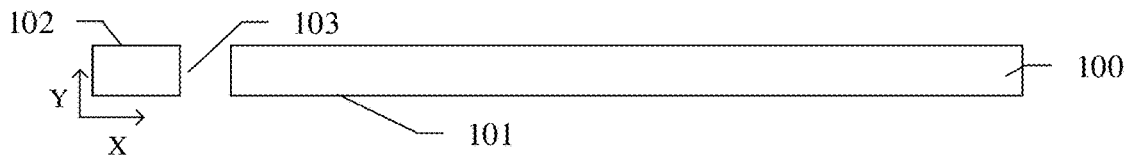
FIG. 4A-FIG. 4Q are partial structural views illustrating each process stage of an array substrate provided by an embodiment of the present disclosure.

Another embodiment of the present disclosure provides a manufacturing method of an array substrate. FIG. 3 is a flowchart of the manufacturing method of the array substrate provided by the present embodiment, and FIG. 4A-FIG. 4Q are partial structural views illustrating each process stage of the array substrate provided by the present embodiment. As shown in FIG. 3 and FIGS. 4A-4Q, the manufacturing method of the array substrate includes:

S201: providing a substrate, the base substrate including a first surface and a second surface opposite to each other, and a through-hole penetrating the base substrate from the first surface to the second surface.

For example, a material of the base substrate can include one or more selected from the group consisting of glass, polyimide, polycarbonate, polyacrylate, polyetherimide, polyethersulfone, which is included, but is not limited thereto in the present embodiment.

For example, as shown in FIG. 4A, the base substrate 100 includes the first surface 101 and the second surface 102 opposite to each other in the Y direction. The Y direction here refers to a direction perpendicular to the main plane of the base substrate 100.

For example, as shown in FIG. 4A, a step of providing the base substrate can include forming the through-hole 103 in the base substrate 100.

For example, as shown in FIG. 4A, the through-hole 103 formed in the base substrate 100 penetrates the base substrate 100 in the Y direction. For example, the through-hole 103 can be formed by means of laser cutting, etc., which is not limited in this embodiment.

S202: forming a data line on the first surface of the base substrate, the data line being at least partially filled in the through-hole.

Figure 4B:
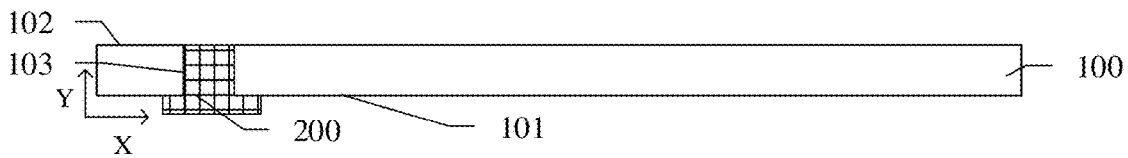

For example, as shown in FIG. 4B, the data line 200 is patterned on the first surface 101 of the base substrate 100 by a mask process, and a portion of the formed data line 200 penetrates the base substrate 100 through the through-hole 103. For example, the data line 200 extends in a direction perpendicular to the XY plane.

For example, a material of data line 200 can include one or a combination of several of aluminum, platinum, silver, gold, nickel, chromium, copper and the like, the present embodiment includes but is not limited thereto.

Figure 4C:
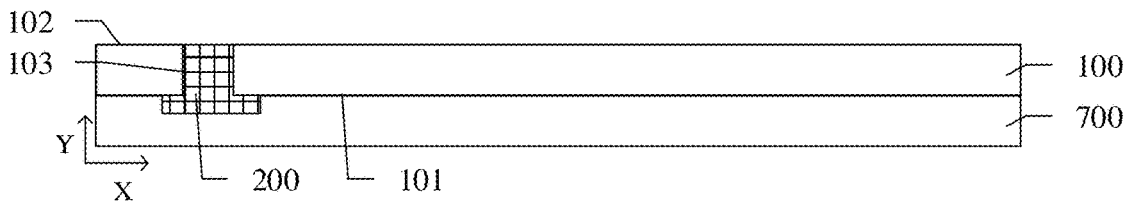

In some examples, as shown in FIG. 4C, a second passivation layer 700 is formed on a side of the data line 200 away from the base substrate 100, the second passivation layer 700 is served to protect the data line 200 located on the first surface 101 of the base substrate 100.

For example, a material of the second passivation layer 700 can include an inorganic material such as a metal oxide, a metal sulfide, or a metal nitride, which is not limited in the present embodiment. For example, the metal oxide can include calcium oxide, zinc oxide, copper oxide, titanium dioxide, tin oxide, etc.; the metal sulfide can include iron sulfide, copper sulfide, zinc sulfide, tin disulfide, etc.; the metal nitride can include silicon nitride, aluminum nitride, etc., which is included, but is not limited thereto in the present embodiment.

For example, the second passivation layer 700 has a thickness of 500 to 3000 Å in the Y direction, which is included, but is not limited thereto in the present embodiment. For example, the second passivation layer 700 has a thickness of 1000 Å.

Figure 4D:
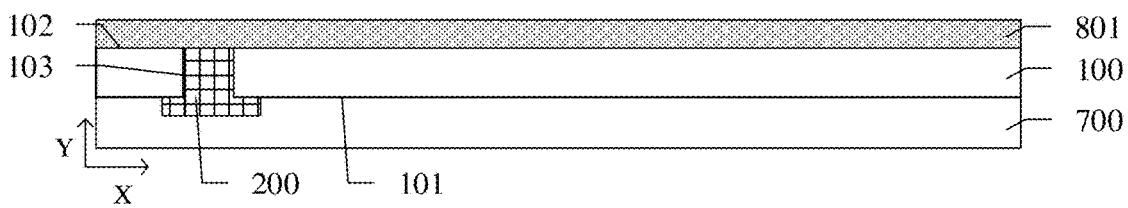

In some examples, as shown in FIG. 4D, a buffer material layer 801 is formed on the second surface 102 of the base substrate 100, that is, the buffer material layer 801 is deposited on a side of the base substrate 100 away from the data line 200.

For example, as shown in FIG. 4D, a material of the buffer material layer 801 can include silicon nitride, etc., which is included, but is not limited thereto in the present embodiment. For example, the thickness of the buffer material layer 801 in the Y direction is 500-1000 Å, which is included, but is not limited thereto in the present embodiment.

S203: forming a thin film transistor on the second surface of the base substrate, wherein the thin film transistor includes a source electrode and a drain electrode, and the source electrode is electrically connected to the data line.

Figure 4E:
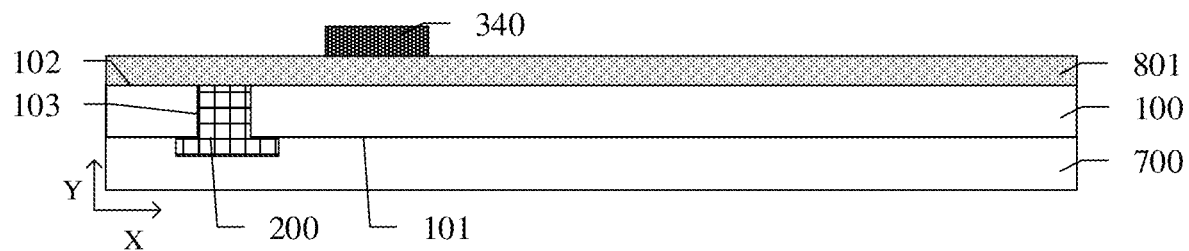

In some examples, as shown in FIG. 4E, a gate electrode 340 is formed on the second surface 102 of the base substrate 100 by a mask patterning process, that is, the gate electrode 340 is formed on a side of the buffer material layer 801 away from the base substrate 100.

Figure 4F:
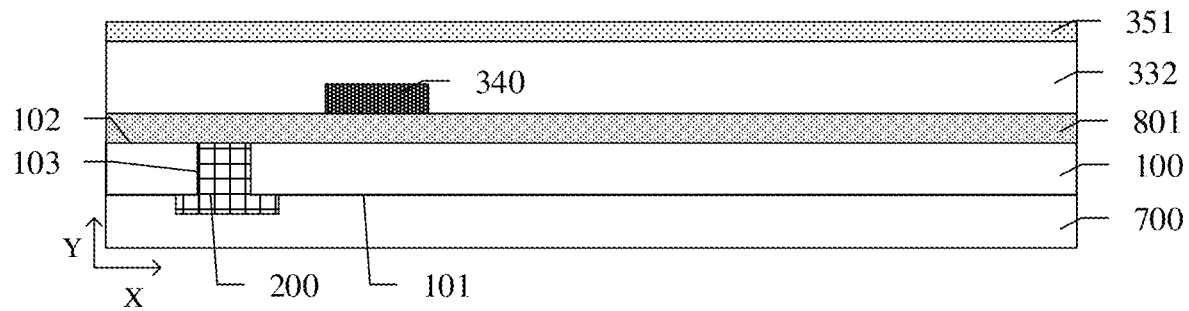

In some examples, as shown in FIG. 4F, an insulating material layer 332 and a semiconductor layer 351 are formed in sequence on the gate electrode 340.

For example, the insulating material layer 332 is deposited on the gate electrode 340 by chemical vapor deposition to cover the gate electrode 340. For example, the insulating material layer 332 can include a material such as an oxide, a nitride, or an oxynitride, which is not limited in the present embodiment.

For example, a buffer layer, a gate insulating layer, and an active layer in the present embodiment are formed by one patterning process. The one-step patterning process here refers to forming the buffer layer, the gate insulating layer and the active layer by one exposure using the same mask plate.

Figure 4G:
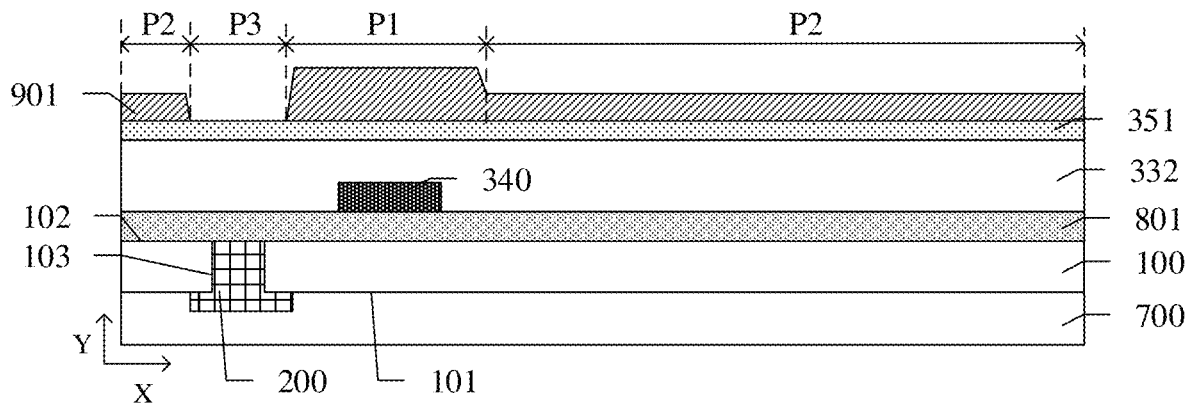

For example, as shown in FIG. 4G, a first photoresist layer 901 is formed on the semiconductor layer 351, and the first photoresist layer is patterned by a half-tone mask process or a gray tone mask process to form a first photoresist pattern having different thicknesses. For example, a first photoresist pattern having a step coating can be formed by photolithography using a half-tone mask. The half-tone mask consists of a shielding part for shielding an ultraviolet ray, a half-tone transmission part for partially transmitting the ultraviolet ray using a phase shift material, and a full transmission part for fully transmitting the ultraviolet ray. The first photoresist pattern includes a first photoresist-completely-retained region P1 and a first photoresist-partially-removed region P2 which have different thicknesses, and a first photoresist-completely-removed region P3 formed by photolithography using a half-tone mask.

For example, the semiconductor layer 351 at a position where a via hole is to be formed is not covered by the first photoresist layer 901, that is, the semiconductor layer 351 at the position where the via hole is to be formed is located in the first photoresist-completely-removed region P3. For example, at least the semiconductor layer 351 right above the through-hole 103 is not covered by the first photoresist layer 901. For example, a thickness of the first photoresist layer 901 at a position where an active layer pattern is to be formed is greater than a thickness of the first photoresist layer 901 at a position where the active layer pattern is not to be formed, that is, the position where the active layer pattern is to be formed is located in the first photoresist-completely-retained region P1, and the position where the active layer pattern is not to be formed is located in the first photoresist-partially-removed region P2.

Figure 4H:
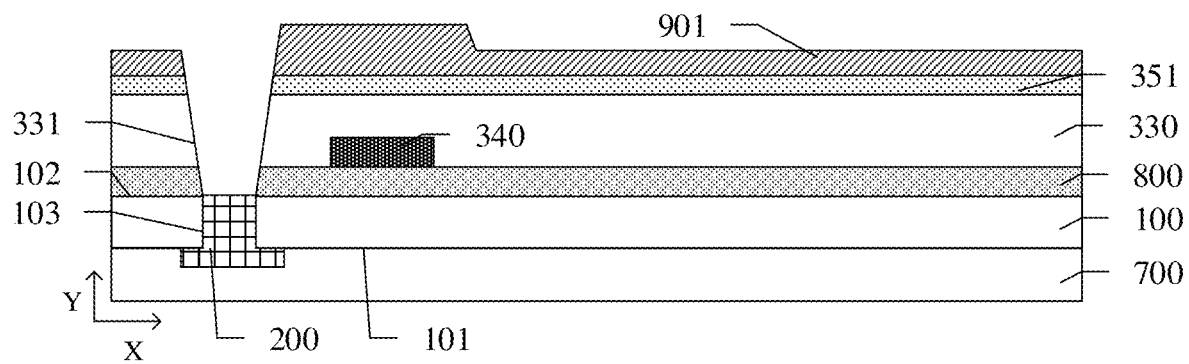

For example, as shown in FIG. 4H, the semiconductor layer 351, the insulating material layer 332, and the buffer material layer 801 are patterned to form a gate insulating layer 330 including a via hole 331 and a buffer layer 800, that is, in the present embodiment, the buffer layer 800 and the gate insulating layer 330 are formed by one patterning process. An orthographic projection of the formed via hole 331 on the base substrate 100 at least partially overlaps with the through-hole 103 on the base substrate 100, therefore, the portion of the data line 200 extending to the second surface 102 of the base substrate 100 through the through-hole 103 is exposed by the via hole 331 of the gate insulating layer 330.

Figure 4I:
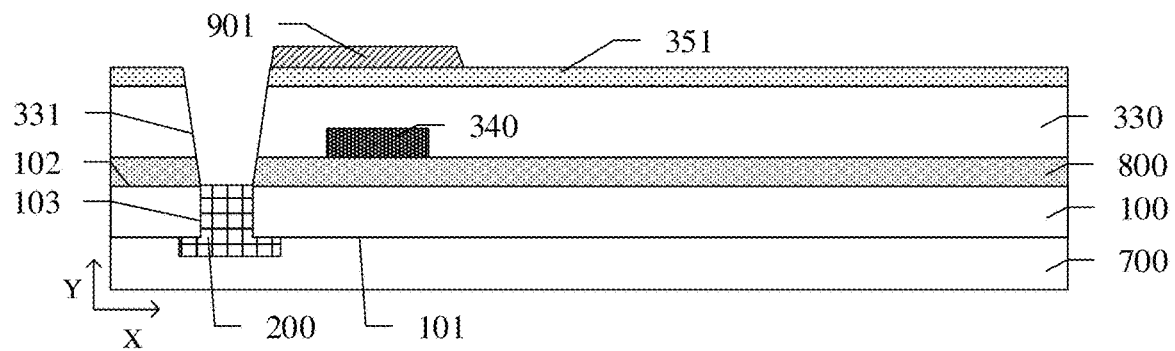

For example, as shown in FIG. 4I, the first photoresist layer 901 is ashed, so that the first photoresist layer 901 at the position where the active layer pattern is to be formed is thinned, while the first photoresist layer 901 at other positions is completely ashed and removed, that is, the first photoresist layer 901 is ashed, so that the photoresist in the first photoresist-completely-retained region P1 is thinned, and the photoresist in the first photoresist-partially-removed region P2 is completely removed.

Figure 4J:
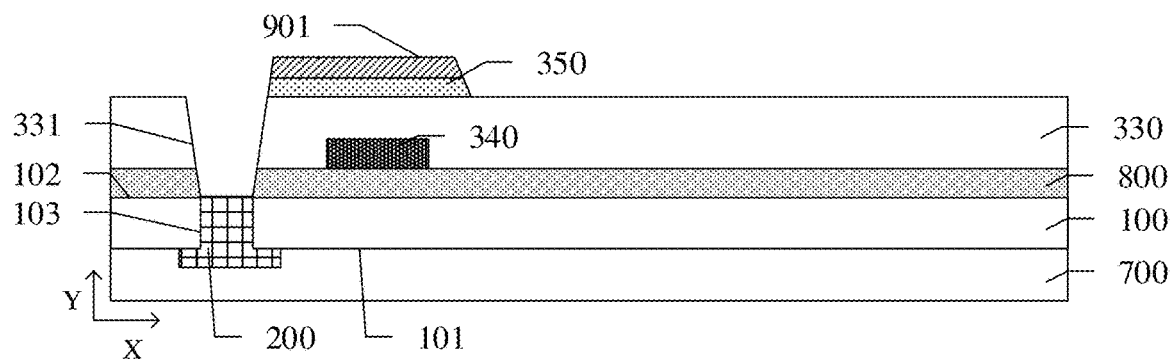

For example, as shown in FIG. 4J, the semiconductor layer 351 not covered by the first photoresist layer 901 is etched to form the active layer pattern.

Figure 4K:
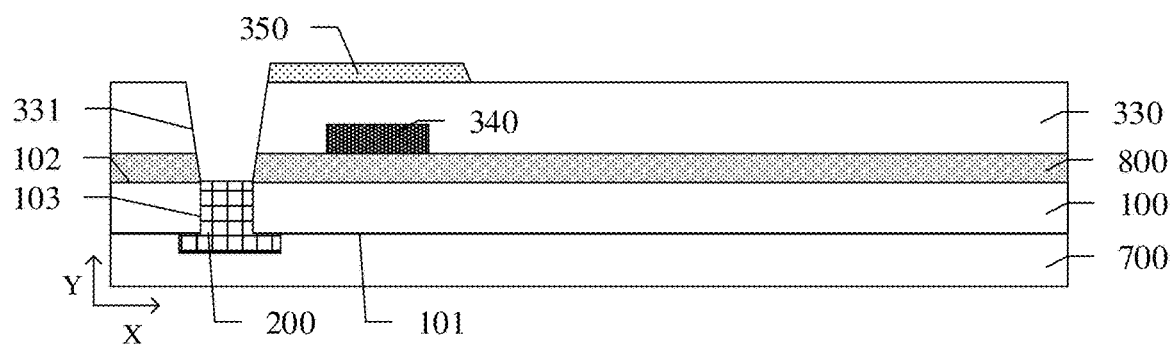

For example, as shown in FIG. 4K, the first photoresist layer 901 on the active layer pattern is stripped to form the active layer 350. Therefore, the gate insulating layer and the active layer of the present embodiment are formed by one patterning process, and the one-step patterning process employs a photoresist pattern layer formed by a half-tone mask process or a gray tone process.

For example, a source electrode, a drain electrode, and a common electrode, provided by the present embodiment, are formed by one patterning process. The one-step patterning process here refers that the source electrode, the drain electrode, and the common electrode are formed by exposing a first conductive material layer and a second conductive material layer using the same mask plate for once.

Figure 4L:
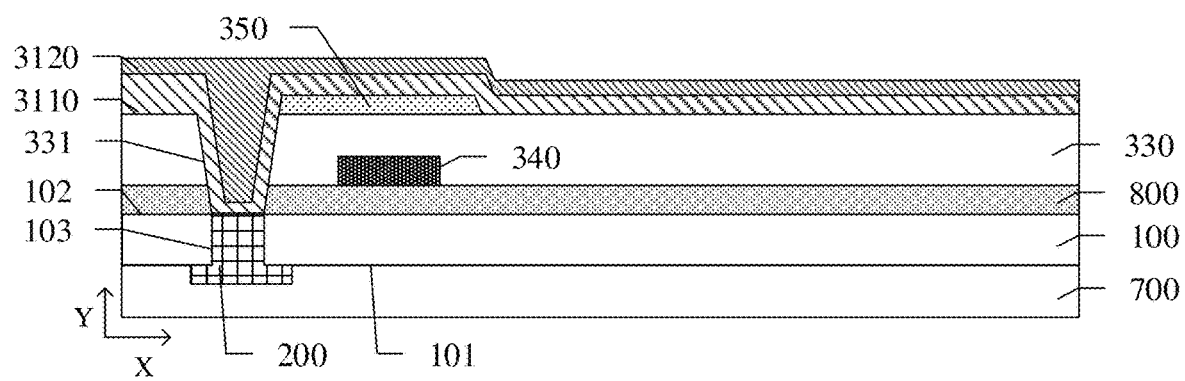

In some examples, as shown in FIG. 4L, the method for forming the array substrate further includes: forming a first conductive material layer 3110 on the gate insulating layer 330 and the active layer 350, and forming a second conductive material layer 3120 on a side of the first conductive material layer 3110 away from the gate insulating layer 330.

For example, a material of the first conductive material layer 3110 includes a transparent conductive material or a metal material, etc. For example, the material of the first conductive material layer 3110 can include a transparent conductive oxide. For example, the material of the first conductive material layer 3110 can include any combination or at least one selected from the group consisting of indium tin oxide, indium zinc oxide, zinc oxide, indium oxide, and indium gallium oxide, which is not limited in the embodiment of the present disclosure. Upon the first conductive material layer 3110 being made of a metal material, the first conductive material layer 3110 is made very thin to make the metal material layer a transparent conductive layer.

Figure 4M:
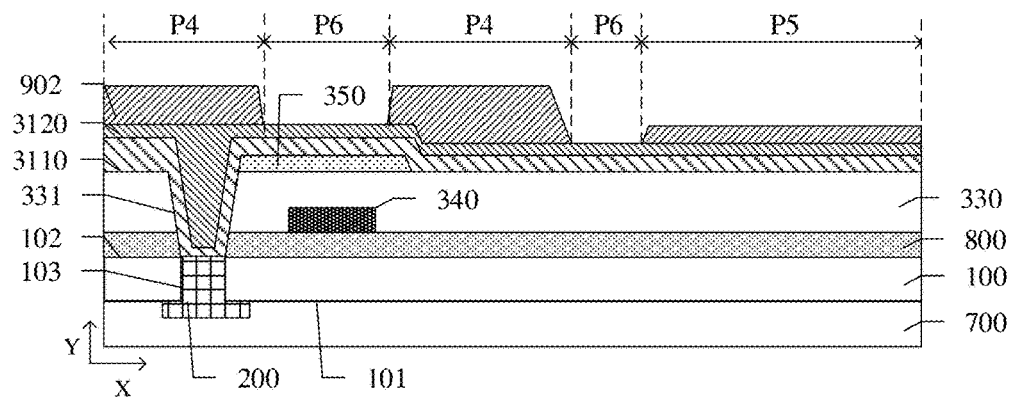

For example, as shown in FIG. 4M, a second photoresist layer 902 is formed on the second conductive material layer 3120, and the second photoresist layer 902 is patterned by a half-tone mask process or a gray tone mask process to form a second photoresist pattern having different thicknesses, that is, the second photoresist layer 902 is patterned to form a second photoresist-completely-retained region P4, a second photoresist-partially-removed region P5, and a second photoresist-completely-removed region P6. A thickness of photoresist in the second photoresist-completely-retained region P4 is greater than a thickness of photoresist in the second photoresist-partially-removed region P5.

For example, the second photoresist-completely-retained region P4 is formed in a region where the source electrode and drain electrode are to be formed, the second photoresist-partially-removed region P5 is formed in a region where the common electrode is to be formed, and the second photoresist-completely-removed region P6 is formed in a region other than the regions where the source electrode and drain electrode and the common electrode are to be formed.

Figure 4N:
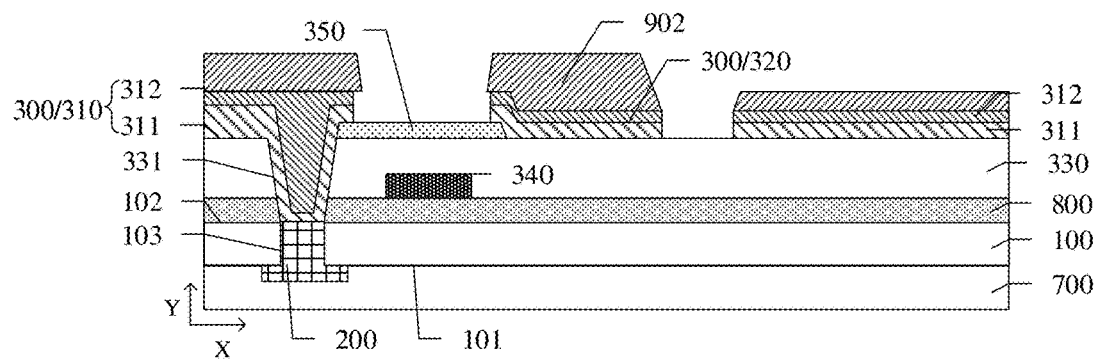

For example, as shown in FIG. 4N, the first conductive material layer 3110 and the second conductive material layer 3120 are patterned to expose a part of the active layer 350 and a part of the gate insulating layer 330, that is, a first conductive layer 311 and a second conductive layer 312 are respectively formed by etching the first conductive material layer 3110 and the second conductive material layer 3120 in the second photoresist-completely-removed region P6. The first conductive layer 311 and the second conductive layer 312 in the present embodiment can be formed by etching in the same step of an etching process, or can be formed by stepwise etching, which is not limited in the present embodiment.

Figure 4O:
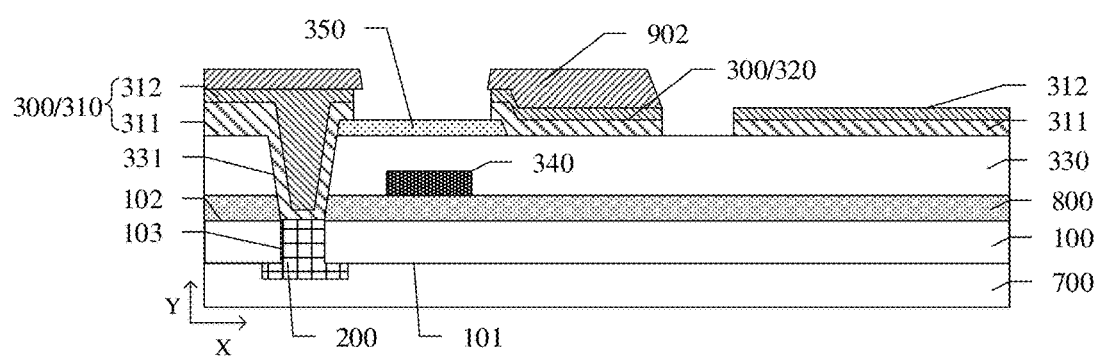

For example, as shown in FIG. 4O, the second photoresist layer 902 is ashed, so that the second photoresist layer 902 at a position where a pattern of the source electrode and drain electrode are to be formed is thinned, and the second photoresist layer 902 at a position where the common electrode is to be formed is completely ashed and removed, that is, the second photoresist layer 902 is ashed, so that the photoresist in the second photoresist-completely-retained region P4 is thinned, and the photoresist in the second photoresist-partially-removed region P5 is completely removed.

Figure 4P:
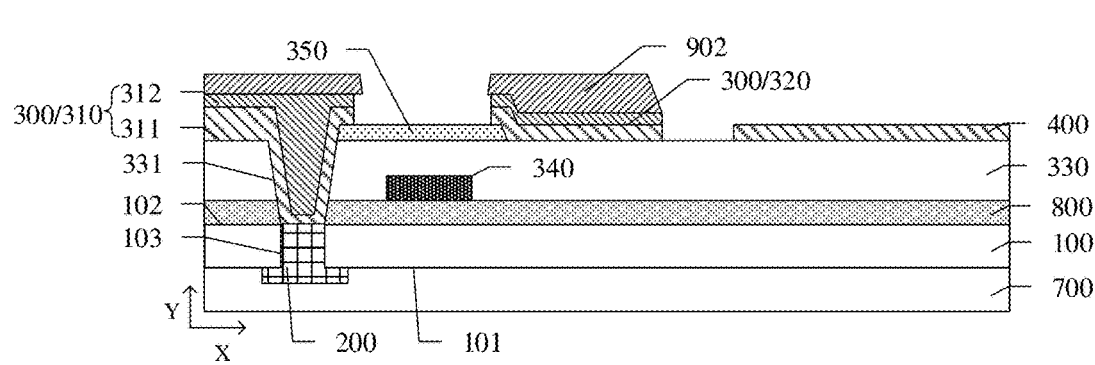
Figure 4Q:
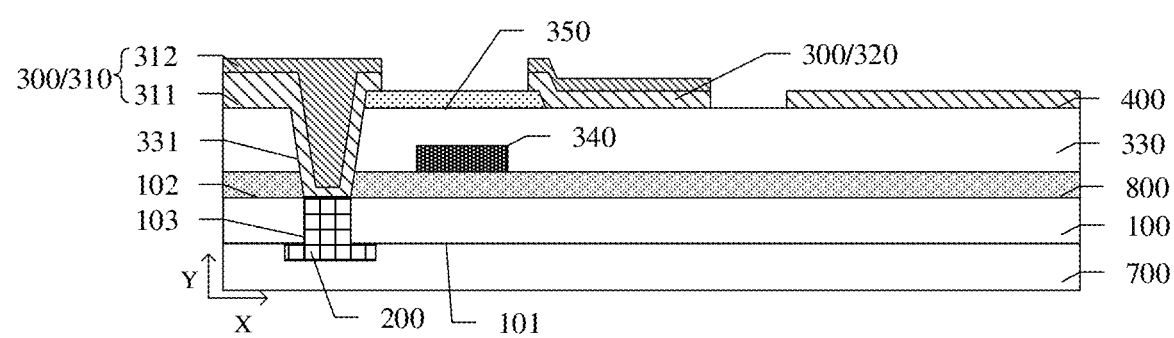

For example, as shown in FIG. 4P, the second conductive layer 312 not covered by the second photoresist layer 902 is etched to remove the exposed second conductive layer 312, thereby forming a common electrode 400 only including the first conductive layer 311, that is, the second conductive layer 312 located in the second photoresist-partially-removed region P5 is etched to remove the second conductive layer 312, thereby forming the common electrode 400.

For example, as shown in FIG. 4Q, the second photoresist layer 902 on the pattern of the source electrode and drain electrode is stripped to form the source electrode 310 and the drain electrode 320, that is, the photoresist in the second photoresist-completely-retained region P4 is stripped to form the source electrode 310 and the drain electrode 320. The source electrode 310 and the drain electrode 320 are formed through one exposure process by using the same mask plate for the two conductive material layers. The source electrode 310 is electrically connected to the data line 200 on the first surface 101 of the base substrate 100 through the via hole 331. A gap between the common electrode 400 and the drain electrode 320 serves to insulate the common electrode 400 and the drain electrode 320 from each other. As can be seen from the above steps, the source electrode, the drain electrode and the common electrode of the present embodiment are formed by one patterning process, and the first conductive layer included in the source electrode and drain electrode is in the same layer as the common electrode, and the material of the source electrode and drain electrode is a transparent conductive material the same as the material of the common electrode, that is, the first conductive layer included in the source electrode and drain electrode and the common electrode are formed by patterning the same conductive material layer through the same mask plate through one exposure process.

For example, a material of the active layer 350 includes indium gallium zinc oxide, and a material of the second conductive layer 312 of the source electrode 310 and the drain electrode 320 includes copper. In the process of etching the second conductive layer 312 to form the source electrode and the drain electrode, if the second conductive layer 312 is made of aluminum, and the material of the active layer 350 includes indium gallium zinc oxide, an etching solution will also etch the active layer 350 while etching the second conductive layer 312. Therefore, upon the material of the active layer 350 including indium gallium zinc oxide, the material of the second conductive layer 312 included in the source electrode 310 and the drain electrode 320 need to be a copper material.

In some examples, as shown in FIG. 2B, the manufacturing method of the array substrate further includes forming a first passivation layer 500 on a side of the common electrode 400 away from the base substrate 100 by using a mask process, and forming a pixel electrode 600 on a side of the first passivation layer 500 away from the common electrode 400 by using a mask process. The pixel electrode 600 is electrically connected to the drain electrode 320 of the thin film transistor 300. For example, the pixel electrode 600 in the present embodiment is a strip electrode.

Therefore, it can be seen from the above steps of the process that, compared with a manufacturing process of an array substrate including a gate insulating layer mask process, the manufacturing method of the array substrate provided by the present embodiment can effectively avoid signal crosstalk between the data line and the common electrode, and minimize the parasitic capacitance formed between the data line and the common electrode, thereby not only reducing power consumption, but also saving the steps of the resin process and the gate insulating layer mask process.

The embodiment of the present disclosure is described by taking that the array substrate includes a thin film transistor of a bottom gate type as an example, which is not limited thereto. For example, the array substrate can alternatively include a thin film transistor of a top gate type, that is, a source electrode, a drain electrode and a common electrode are formed on a buffer layer by one patterning process, and a gate insulating layer, a gate electrode, a passivation layer, and a pixel electrode are formed in sequence on the source electrode, the drain electrode and the common electrode.

At least one embodiment of the present disclosure also provides a display device, which includes the array substrate provided by any embodiment of the present disclosure. Therefore, the display device can avoid signal crosstalk between the data line and the common electrode, minimize the parasitic capacitance formed between the data line and the common electrode, and reduce power consumption, thereby improving the picture quality of the display device.

For example, the display device can be a liquid crystal display device and any product or component including the display device and having a display function such as a television, a digital camera, a mobile phone, a watch, a tablet computer, a notebook computer, a navigator, etc., which is not limited thereto in the present embodiment.

For example, the display device is a display device applying a high aperture advanced-super dimensional switching (HADS) technology.

The following statements should be noted:

(1) Unless otherwise defined, the same reference numeral represents the same meaning in the embodiments of the disclosure and accompanying drawings.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. An array substrate, comprising:
a base substrate, comprising a first surface and a second surface opposite to each other, and a through-hole penetrating the base substrate from the first surface to the second surface;
a data line on the first surface of the base substrate, the data line being at least partially filled in the through-hole; and
a thin film transistor on the second surface of the base substrate, the thin film transistor comprising a source electrode and a drain electrode, and the source electrode being electrically connected to the data line,
wherein the array substrate further comprises: a common electrode on the second surface of the base substrate, an orthographic projection of the data line on the base substrate at least partially overlaps with an orthographic projection of the common electrode on the base substrate, and the source electrode, the drain electrode, and the common electrode are formed in a same layer.

2. The array substrate according to claim 1, wherein, in a direction perpendicular to the second surface of the base substrate and away from the second surface, the source electrode and the drain electrode comprise a first conductive layer and a second conductive layer stacked in sequence, and an orthographic projection of the first conductive layer on the base substrate and an orthographic projection of the second conductive layer on the base substrate completely coincide with each other.

3. The array substrate according to claim 2, wherein a material of the first conductive layer is a transparent conductive material the same as a material of the common electrode, and the first conductive layer and the common electrode are disposed in a same layer.

4. The array substrate according to claim 1, further comprising:
a first passivation layer on a side of the common electrode away from the base substrate; and
a pixel electrode on a side of the first passivation layer away from the common electrode.

5. The array substrate according to claim 1, wherein the thin film transistor further comprises a gate insulating layer, the gate insulating layer comprises a via hole, and the source electrode is electrically connected to the data line through the via hole.

6. The array substrate according to claim 1, further comprising:
a second passivation layer on a side of the data line away from the base substrate.

7. A manufacturing method of an array substrate, comprising:
providing a base substrate, the base substrate comprising a first surface and a second surface opposite to each other, and a through-hole penetrating the base substrate from the first surface to the second surface;
forming a data line on the first surface of the base substrate, the data line being at least partially filled in the through-hole; and
forming a thin film transistor on the second surface of the base substrate, the forming the thin film transistor comprising forming a source electrode and a drain electrode, and the source electrode being electrically connected to the data line,
wherein the manufacturing method further comprises:
forming a common electrode on the second surface of the base substrate,
wherein the source electrode, the drain electrode, and the common electrode are formed by one patterning process,
an orthographic projection of the data line on the base substrate at least partially overlaps with an orthographic projection of the common electrode on the base substrate, and the source electrode, the drain electrode, and the common electrode are formed in a same layer.

8. The manufacturing method of the array substrate according to claim 7, wherein the providing the base substrate comprises:
forming the through-hole in the base substrate.

9. The manufacturing method of the array substrate according to claim 7, wherein the forming the thin film transistor further comprises:
forming an insulating material layer and a semiconductor layer in sequence on the second surface of the base substrate; and
forming a gate insulating layer and an active layer by using one patterning process on the insulating material layer and the semiconductor layer,
wherein the gate insulating layer comprises a via hole, and the source electrode is electrically connected to the data line through the via hole.

10. The manufacturing method of the array substrate according to claim 9, wherein the forming the gate insulating layer and the active layer by using one patterning process on the insulating material layer and the semiconductor layer comprises:
forming a first photoresist layer on the semiconductor layer;
forming a first photoresist-completely-retained region, a first photoresist-partially-removed region, and a first photoresist-completely-removed region by patterning the first photoresist layer, wherein a thickness of photoresist in the first photoresist-completely-retained region is greater than a thickness of photoresist in the first photoresist-partially-removed region;
forming the gate insulating layer including the via hole by etching the insulating material layer and the semiconductor layer in the first photoresist-completely-removed region;
ashing the first photoresist layer to reduce the thickness of the photoresist in the first photoresist-completely-retained region, and to remove the photoresist in the first photoresist-partially-removed region completely; and
forming the active layer by etching the semiconductor layer in the first photoresist-partially-removed region.

11. The manufacturing method of the array substrate according to claim 9, before the forming the insulating material layer, further comprising:
forming a buffer material layer on the second surface of the base substrate, wherein the forming the gate insulating layer and the active layer by using one patterning process on the insulating material layer and the semiconductor layer comprises: forming a buffer layer and the gate insulating layer by using one patterning process on the buffer material layer and the insulating material layer.

12. The manufacturing method of the array substrate according to claim 7, wherein the forming the source electrode and the drain electrode, and the forming the common electrode comprises:

forming a first conductive material layer on the second surface of the base substrate;

forming a second conductive material layer on the first conductive material layer;

forming a second photoresist layer on the second conductive material layer;

forming a second photoresist-completely-retained region, a second photoresist-partially-removed region, and a second photoresist-completely-removed region by patterning the second photoresist layer, wherein a thickness of photoresist in the second photoresist-completely-retained region is greater than a thickness of photoresist in the second photoresist-partially-removed region;

forming a first conductive layer and a second conductive layer respectively by etching the first conductive material layer and the second conductive material layer in the second photoresist-completely-removed region;

ashing the second photoresist layer to reduce the thickness of the photoresist in the second photoresist-completely-retained region, and to remove the photoresist in the second photoresist-partially-removed region completely;

etching the second conductive layer in the second photoresist-partially-removed region to remove the second conductive layer, so as to form the common electrode; and forming the source electrode and the drain electrode by stripping the photoresist in the second photoresist-completely-retained region.

13. The manufacturing method of the array substrate according to claim 7, after forming the data line, further comprising:

forming a second passivation layer on a side of the data line away from the base substrate.

14. A display device, comprising the array substrate according to claim 1.

* * * * *